United States Patent
Guan et al.

(10) Patent No.: US 9,024,677 B2
(45) Date of Patent: May 5, 2015

(54) METHOD AND APPARATUS FOR DRAIN SWITCHING WITH REPLICATION LOOP FOR FAST LED TURN ON TIME

(75) Inventors: Hua Guan, San Diego, CA (US); Eric B. Zeisel, San Diego, CA (US); Qi Lou, Lake Forest, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 13/535,015

(22) Filed: Jun. 27, 2012

(65) Prior Publication Data

US 2014/0002174 A1    Jan. 2, 2014

(51) Int. Cl.
H03K 17/042    (2006.01)
G05F 1/10    (2006.01)

(52) U.S. Cl.
CPC ............................ H03K 17/04206 (2013.01)

(58) Field of Classification Search
None
See application file for complete search history.

(56) References Cited

U.S. PATENT DOCUMENTS

| | | | |
|---|---|---|---|
| 6,107,889 A | 8/2000 | Strange et al. | |
| 7,009,432 B2 | 3/2006 | Beghein | |
| 7,482,864 B1 | 1/2009 | Murmann et al. | |
| 7,609,734 B2 * | 10/2009 | Rees et al. | 372/38.02 |
| 7,825,882 B2 | 11/2010 | Wei et al. | |
| 2008/0290911 A1 | 11/2008 | Williams | |
| 2010/0019697 A1 | 1/2010 | Korsunsky et al. | |
| 2011/0254469 A1 | 10/2011 | Ruan et al. | |
| 2012/0074987 A1 * | 3/2012 | Piepenstock et al. | 327/108 |

OTHER PUBLICATIONS

International Search Report and Written Opinion—PCT/US2013/047980—ISA/EPO—Jan. 17, 2014.

* cited by examiner

*Primary Examiner* — Lincoln Donovan
*Assistant Examiner* — Terry L Englund

(57) ABSTRACT

A method and apparatus for current drain switching with a replica loop. The method comprises the steps of: matching a voltage across a current sense resistor with a voltage created by a reference current across a matched reference resistor; replicating an operating point of an output transistor using a scaled matched replica of the output transistor and the current sense resistor. The method then shifts a feedback voltage from the output sense resistor to the matched replica sensor and shifts the output of a gate from an output transistor to the replica transistor. A first switch is then actuated in order to preserve the gate charge of the output transistor. A second switch is actuated to sample and hold a drain voltage in the buffer in order to bias the drain of the replica transistor. A third switch is then activated to stop the output current.

3 Claims, 5 Drawing Sheets

US 9,024,677 B2

METHOD AND APPARATUS FOR DRAIN SWITCHING WITH REPLICATION LOOP FOR FAST LED TURN ON TIME

BACKGROUND

1. Field

The present disclosure relates generally to light emitting diodes (LED), and more particularly, to a method and apparatus for drain switching with replication loop to achieve fast turn on time of an LED.

2. Background

Digital dimming is a very popular way to achieve a wide range in average light emitting diode (LED) current. Digital dimming provides greater accuracy than analog dimming in low duty cycles. However, digital dimming has the drawback of the settling time of the current sink or source. In order to achieve very high accuracy in digital dimming, the output current needs to settle to the target current value very quickly. This is especially true where high pulse width modulation (PWM) frequencies, which are outside the audio band, are used and low duty cycles are needed. PWM is an efficient way to provide intermediate amounts of electrical power and is a commonly used technique for controlling power to electrical devices.

Previous solutions to the problem of settling time in digital dimming have turned on and off the gate of the output current source. The output current source has large capacitance due to the large current, such as, 20 mA, and low head room, typically below 250 mV. The turn on settling time is limited by the operational amplifier output stage driving capacity and bandwidth. The turn on time is often hundreds of a nanosecond.

There is a need in the art for drain switching with a replication loop to achieve fast turn on time of an LED drive and provide accurate PWM dimming over temperature at high PWM frequency and a low duty cycle.

SUMMARY

Embodiments disclosed herein provide a method for current drain switching with a replica loop. The method comprises the steps of: matching a voltage across a current sense resistor with a voltage created by a reference current across a matched reference resistor; replicating an operating point of an output transistor using a scaled matched replica of the output transistor and the current sense resistor. The method then shifts a feedback voltage from the output sense resistor to the matched replica sensor and shifts the output of a gate from an output transistor to the replica transistor. A first switch is then actuated in order to preserve the gate charge of the output transistor. A second switch is actuated to sample and hold a drain voltage in the buffer in order to bias the drain of the replica transistor. The third switch is then activated to stop the output current.

An additional embodiment provides an apparatus for current drain switching with a replica loop. The apparatus includes: means for matching a voltage across a current sense resistor with a voltage created by a reference current across a matched reference resistor; means for replicating an operating point of an output transistor using a scaled matched replica of the output transistor and the current sense resistor; means for shifting a feedback voltage from the output transistor to the replica transistor; means for actuating a first switch in order to preserve the gate charge of the output transistor; means for actuating the second switch to sample and hold the drain voltage in the buffer in order to bias the drain of the replica transistor; and means for actuating the third switch to stop the output current.

A still further embodiment provides a method for current drain switching with current steering. The method includes the steps of: matching a voltage across the current sense resistor with a voltage created by a reference current across a matched reference resistor; actuating a first switch in order to enable a current sink from an internal current source and cause the current source settle to an accurate level prior to the desired output current turn on time. The method then provides that a second switch is left in a pre-set position before actuating a third switch and deactivating the first switch to steer the accurate current from the internal source to the output.

Yet a further embodiment provides an apparatus for current drain switching with current steering. The apparatus comprises: a current sense resistor for matching current; a reference resistor; an output transistor; and output sense resistor; a first switch that provides an internal current path; a second switch for sampling and holding a drain voltage; a buffer for holding a drain voltage in order to bias the drain of a replica transistor; and a third switch for stopping the output current.

A further embodiment provides an apparatus for current drain switching with current steering. The apparatus includes: means for matching a voltage across a current sense resistor with a voltage created by a reference current across a matched reference resistor; means for actuating a first switch to enable the current sink from the internal current source to make the current settle to an accurate level before the desired output current turn on time; means for leaving a second switch in a pre-set position; and means for actuating a third switch and deactivating the first switch in order to steer the accurate current from the internal source to the output.

DETAILED DESCRIPTION

Various aspects are now described with reference to the drawings. In the following description, for purposes of explanation, numerous specific details are set forth in order to provide a thorough understanding of one or more aspects. It may be evident, however, that such aspect(s) may be practiced without these specific details.

As used in this application, the terms "component," "module," "system" and the like are intended to include a computer-related entity, such as, but not limited to hardware, firmware, a combination of hardware and software, software, or software in execution. For example, a component may be, but is not limited to being, a process running on a processor, a processor, an object, an executable, a thread of execution, a program and/or a computer. By way of illustration, both an application running on a computing device and the computing device can be a component. One or more components can reside within a process and/or thread of execution and a component may be localized on one computer and/or distributed between two or more computers. In addition, these components can execute from various computer readable media having various data structures stored thereon. The components may communicate by way of local and/or remote processes such as in accordance with a signal having one or more data packets, such as data from one component interacting with another component in a local system, distributed system, and/or across a network such as the Internet with other systems by way of the signal.

Moreover, the term "or" is intended to man an inclusive "or" rather than an exclusive "or." That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form.

Figure 1:
FIG. 1 depicts a linear ramp-up model for digital dimming

FIG. 1 illustrates a simple linear ramp up model for digital dimming When $T_R/T_{ON}$=10%, the current error is 5%, as shown by the area in the triangle bounded by the dashed line. If the PWM frequency is 18.75 Khz, the duty cycle=1/128, $T_{ON}$=417 ns. In this scenario, if the settling time is 41.7 ns, then the error is 5%. As the PWM frequency gets higher and the duty cycle gets lower, $T_{ON}$ becomes smaller, and leads to larger errors.

PWM is an efficient way to provide intermediate amounts of electrical power and is a commonly used technique to control power to electrical devices. An LED is one example of a device that may be powered by PWM.

LED devices are commonly used in mobile devices to signal various operation states and modes, but may also be used in a wide variety of other electronic devices as well. While the description herein discussed digital dimming in the context of mobile devices, the methods and apparatus described herein are applicable wherever digital dimming of LED devices is needed. The embodiments described herein may be used in a wide range of products that require fast transient accuracy with low quiescent current. In addition, the embodiments described solve the dilemma between fast transient performance and low quiescent power.

Figure 2:
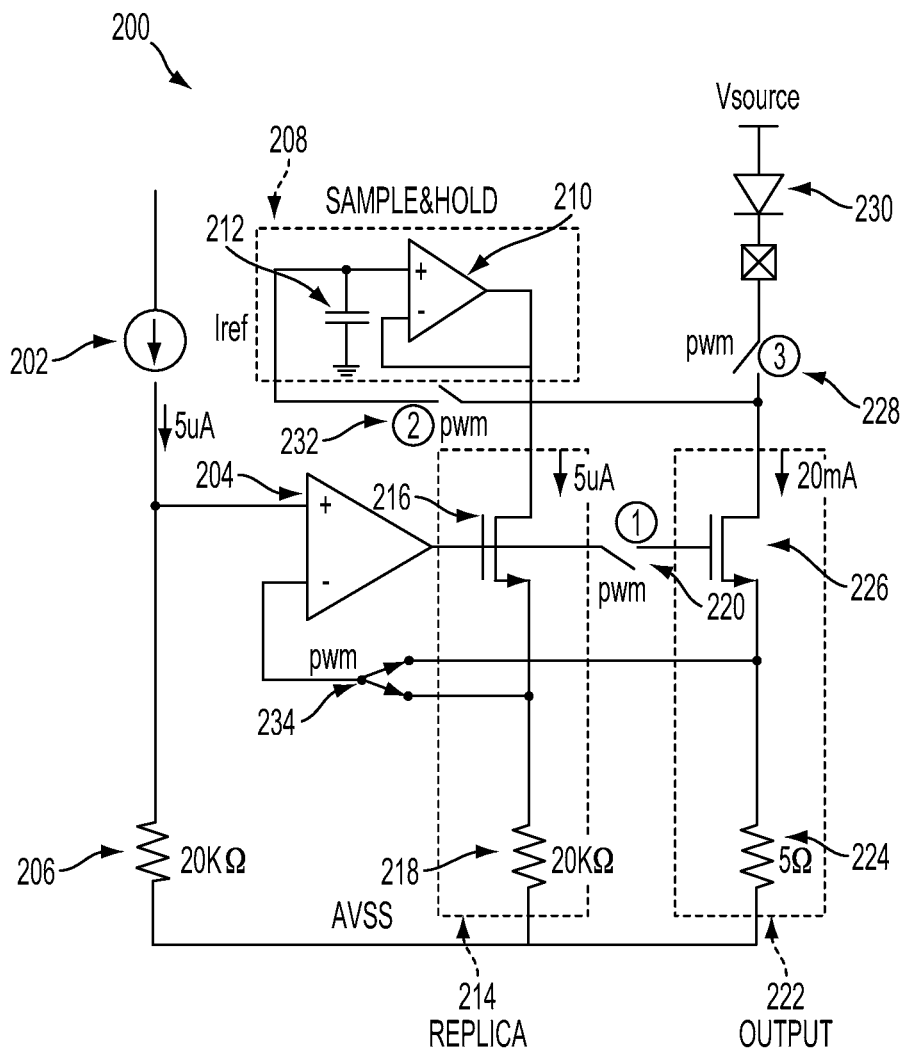
FIG. 2 illustrates an apparatus for digital dimming of LED current according to an embodiment of the invention.

FIG. 2 illustrates embodiments that provide a timing control mechanism that provides that the turn on time is not limited by the output current source gate capacitance. The digital dimming assembly, 200 uses as an input, a reference current, $I_{REF}$ 202. Reference current 202 is input to operational amplifier (op-amp) 204, specifically, input to the positive terminal In addition, reference current 202 is also input to resistor 206. FIG. 2 depicts resistor 206 as a 20 k ohm resistor, however, other values may be used, depending on the application and circuit implementation. Different devices may use different LEDs with different power and current requirements. Resistor 206 may be any value suitable for the particular application. Op-amp 204 receives inputs from single pole double throw switch 234 inputs from replication loop gate charge preserving assembly 214 and output assembly 222. Replication loop gate charge preserving assembly 214 includes metal oxide silicon field effect transistor (MOSFET) 216 and resistor 218, shown as a 20 k ohm resistor, but may be any value suitable for the particular application. The output from the amplifier 204 is coupled to switch 220, which makes or breaks a connection with output current driver assembly 222 consists of MOSFET 226 and resistor 224. Resistor 224 is shown as a 5 ohm resistor, however, resistor 224 may be any value suitable for the particular application.

MOSFET 216 receives as an input the output of sample and hold assembly 208. Sample and hold assembly 208 includes capacitor 212, which stores the output stage drain voltage which is also the input to op-amp 210. Op-amp 210 functions as a current driver whose negative input is a negative feedback loop of op-amp 210. Sample and hold assembly is also connected to switch 228 which switches LED 230 in and out of the circuit.

The embodiment of FIG. 2 provides that the settling time of the output current is not limited to the relatively low bandwidth and low current op-amp. During the off time, a replica loop maintains the same operating point.

The embodiment of FIG. 2 provides a timing control mechanism that ensures that the turn on time is not limited by the gate capacitance of the output current source. The gate charge is preserved during the off state. An optional non-overlapping control of the drain and gate switch further preserves the gate charge. In a sequence, switch 220 is opened in order to keep the gate voltage the same. This is optional if the operating point between the output stage and replica is small thanks to acceptable matching. Switch 220 preserves the drain charge. There is virtually no delay in opening switches 232 and 228 and switching single pole double throw switch 234.

A still further embodiment provides that optional drain tracking can further improve the operating point matching during the off state, further improving accuracy.

FIG. 2 provides drain switching with a replication loop to achieve fast turn on time of the LED drive 230. The topology achieves accurate PWM dimming current accuracy of +/−2% over temperature at high PWM frequency and low duty cycle. FIG. 2 provides for a non-overlapping switch sequence for deactivation (switch 220→switch 232→switch 228) and activation (switch 228→switch 232→switch 220). Switch 234 always shifts position at the same time as switch 220.

Figure 3:
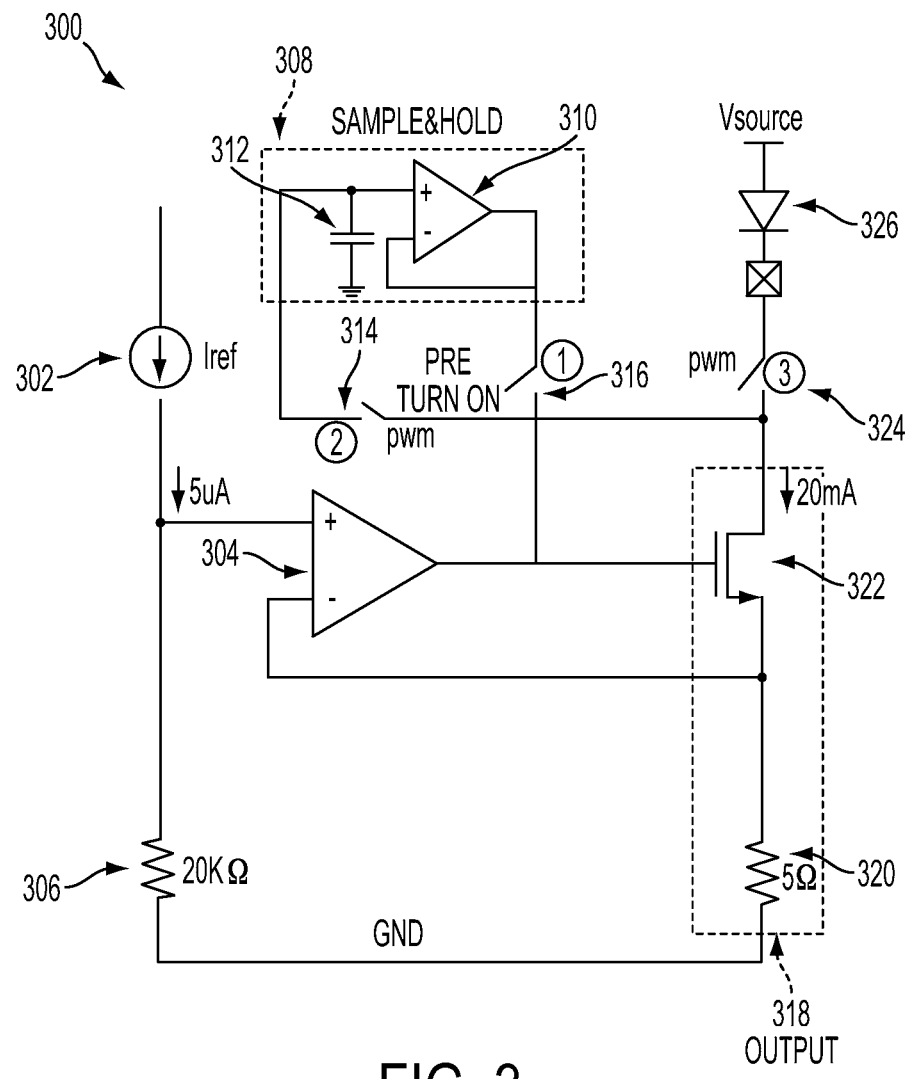
FIG. 3 shows an alternative embodiment of a drain switching apparatus according to an embodiment of the invention.

FIG. 3 depicts an alternate embodiment that provides current steering. In the embodiment depicted in FIG. 3, the turn on time is not limited by the output current source. The output current driver is turned on early, so it settles to the desired level before diverting current from an internal source to the output pin. The assembly 300, includes reference current source $I_{REF}$ 302 which is input to op-amp 304 at the positive terminal The negative input to op-amp 304 is a feedback current amplifier. The reference current source 302 is also connected to resistor 306, shown as 20 k-ohm, but the value of resistor 306 may be selected based on the particular application and the circuit implementation.

The output from op-amp 304 is provided to MOSFET 322. MOSFET 322 also receives as an input the output of sample and hold assembly 308. Sample and hold assembly 308 includes capacitor 312 holding the voltage of the output pin which is the input to op-amp 310. Op-amp 310 functions as a voltage follower current driver .The input of op-amp 310 is connected to switch 314. Sample and hold assembly is also connected to switch 316 and switch 324 which switches LED 326 in and out of the circuit.

Switch 324 also receives input from output current driver assembly 318. Output current driver assembly 318 includes MOSFET 322, which is connected to op-amp 304 and also sense resistor 320. Sense resistor 320 is depicted as 5 ohms, but may be any value suitable for the application and circuit implementation.

For FIG. 3, the deactivation sequence is switch 314 off→>switch 324 off. The activation sequence is switch 316 on→switch 324 on/switch 316 off→switch 314 on. The advantage of this embodiment is low quiescent current during the off mode because the entire output driver is off Optional drain tracking can sense external LED forward voltage, thus further improving the operating point matching during the off state, further improving accuracy.

Figure 4:
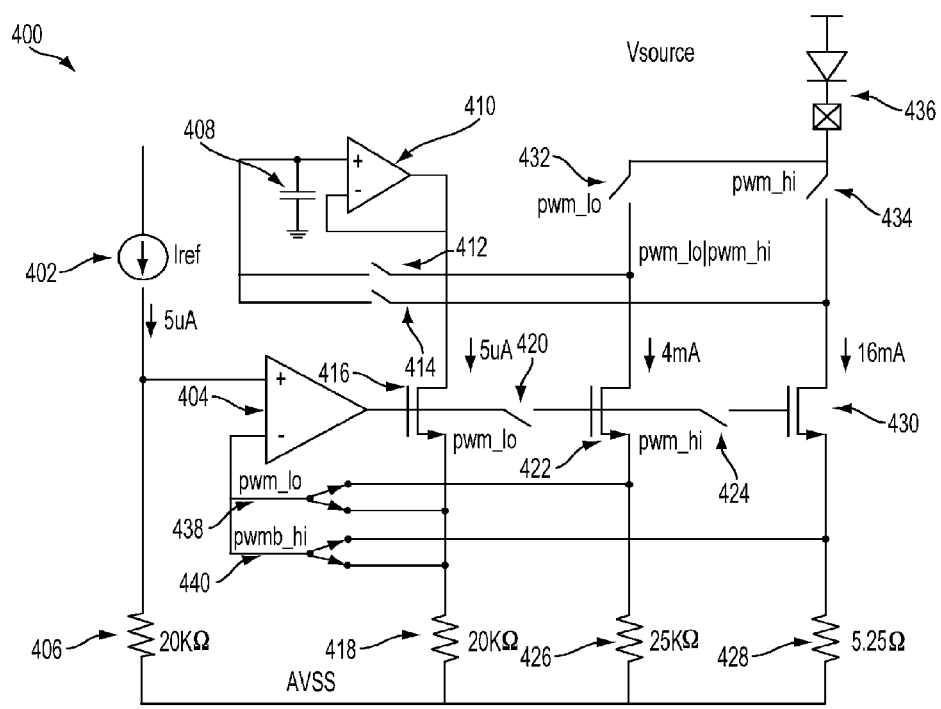
FIG. 4 illustrates an apparatus for drain switching of an LED with multiple output stages sharing a replica according to an embodiment of the invention.

FIG. 4 illustrates an apparatus for drain switching with multiple output stages sharing replica according to an additional embodiment. The assembly, 400 includes input from reference current, $I_{REF}$ 402 that is input to op-amp 404, on the positive terminal. Resistor 406 also provides input to the positive terminal of op-amp 404. Resistor 406 is illustrates as being a 20 kohm resistor, but this value may be adjusted, depending on the application to which the embodiment is applied. Op-amp 404 receives input from single pole double throw switches 438 and 440 on the negative input. The output of op-amp 404 is input to MOSFET 416. MOSFET 416 is also connected to the output of op-amp 410. Op-amp 410 receives input at the positive terminal from capacitor 408 and is also connected to switches 412 and 414. Switch 412 is also connected to switch 432 and MOSFET 422. MOSFET 422 is further connected to single pole double-throw switch 438 and resistor 426. The output of single pole double-throw switch 440 is also connected to resistor 418, depicted as having a value of 20 kilo-ohms". The value of resistor 418 may be varied depending on the needs of the particular application. MOSFET 416 is connected to switch 420, and through switch 420 to MOSFET 422. MOSFET 416 is connected through switch 424 to MOSFET 430. MOSFET 422 is also connected to resistor 426, shown as 25 kilo-ohms, which value may be varied, depending on the needs of the application. MOSFET 430 is connected as well to switch 414 and also to switch 434 and is also connected to resistor 428, illustrates as 6.25 ohms, which value may be selected based on the needs of the application. Switch 434 is connected to LED 436 and also to switch 432. Switch 432 is connected to switch 412 as well.

Figure 5:
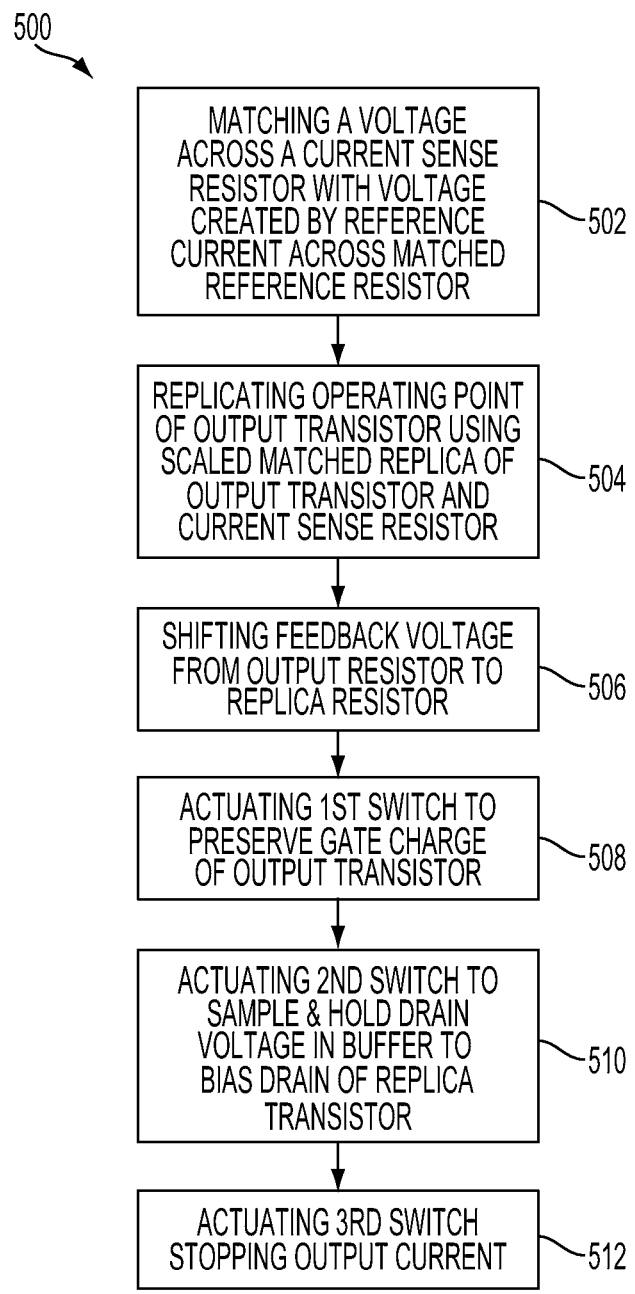
FIG. 5 is a flow chart of a method of drain switching with a replication loop according to an embodiment of the invention.

FIG. 5 provides a flow chart of the use of an embodiment of the invention. The method 500 begins with step 502, which matches a voltage across a current sense resistor with a voltage created by a reference current across a matched reference resistor. The operating point of an output transistor is replicated using a scaled matched replica of the output transistor and the current sense resistor, in step 504. In step 506 a feedback voltage is shifted from the output sense resistor to the matched replica resistor. The output of a gate from an output transistor to the replica transistor is shifted in step 508. At this point, in step 508, a first switch is actuated to preserve a gate charge of the output transistor. In step 510 a second switch is actuated to sample and hold a drain voltage in a buffer to bias the drain of the replica transistor. At step 512, a third switch is actuated to stop the output current.

It is understood that the specific order or hierarchy of steps in the processes disclosed is an illustration of exemplary approaches. Based upon design preferences, it is understood that the specific order or hierarchy of steps in the processes may be rearranged. The accompanying method claims present elements of the various steps in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

What is claimed is:

1. A method for current drain switching with current steering, comprising:
   matching a voltage across a current sense resistor with a voltage created by a reference current across a matched reference resistor;
   actuating a first switch to enable a current sink from an internal current source to settle to an accurate current level before a desired output current turn on time; and
   actuating a second switch and deactivating the first switch to steer the accurate current level from the internal current source to an output.

2. An apparatus for current drain switching with current steering, comprising:
   means for matching a voltage across a current sense resistor with a voltage created by a reference current across a matched reference resistor;
   means for actuating a first switch to enable a current sink from an internal current source to settle to an accurate current level before a desired output current turn on time;
   means for actuating a second switch and deactivating the first switch to steer the accurate current level from the internal current source to an output.

3. A non-transitory computer-readable medium containing instructions for current drain switching with current steering, which when executed, cause a processor to perform the steps of:
   matching a voltage across a current sense resistor with a voltage created by a reference current across a matched reference resistor;
   actuating a first switch to enable a current sink from an internal current source to settle to an accurate current level before a desired output current turn on time; and
   activating a second switch and deactuating the first switch to steer the accurate current level from the internal current source to an output.

* * * * *